(12) United States Patent
Gellis et al.

(10) Patent No.: US 12,489,304 B2
(45) Date of Patent: Dec. 2, 2025

(54) GaN USB WIRING DEVICE

(71) Applicant: Hubbell Incorporated, Shelton, CT (US)

(72) Inventors: David Samuel Gellis, Bridgeport, CT (US); John Edward Brower, Fairfield, CT (US)

(73) Assignee: Hubbell Incorporated, Shelton, CT (US)

( * ) Notice: Subject to any disclaimer, the term of this patent is extended or adjusted under 35 U.S.C. 154(b) by 745 days.

(21) Appl. No.: 17/836,701

(22) Filed: Jun. 9, 2022

(65) Prior Publication Data

US 2022/0399729 A1 Dec. 15, 2022

Related U.S. Application Data

(60) Provisional application No. 63/209,634, filed on Jun. 11, 2021.

(51) Int. Cl.
| | |
|---|---|
| *H01M 10/46* | (2006.01) |
| *H01R 13/648* | (2006.01) |
| *H01R 13/70* | (2006.01) |
| *H01R 27/02* | (2006.01) |
| *H02J 7/00* | (2006.01) |
| *H02M 3/335* | (2006.01) |
| *H05K 1/14* | (2006.01) |
| *H05K 1/16* | (2006.01) |
| *H05K 1/18* | (2006.01) |

(52) U.S. Cl.
CPC ........ *H02J 7/0042* (2013.01); *H01R 13/6485* (2013.01); *H01R 13/70* (2013.01); *H01R 27/02* (2013.01); *H02M 3/335* (2013.01); *H05K 1/14* (2013.01); *H05K 1/165* (2013.01); *H05K 1/18* (2013.01); *H05K 2201/10166* (2013.01); *H05K 2201/10174* (2013.01); *H05K 2201/10189* (2013.01)

(58) Field of Classification Search
CPC .......... G06F 1/266; H05K 1/18; H05K 3/335; H05K 1/141
USPC ................. 320/107, 111, 140, 141
See application file for complete search history.

(56) References Cited

U.S. PATENT DOCUMENTS

| | | | |
|---|---|---|---|
| 5,015,201 A | 5/1991 | Brezee et al. | |
| 2002/0159214 A1 | 10/2002 | Perlick et al. | |
| 2006/0158908 A1 | 7/2006 | Usui | |
| 2017/0149347 A1 * | 5/2017 | Reiter | ................. H01R 12/716 |
| 2021/0141756 A1 | 5/2021 | Heyd et al. | |

FOREIGN PATENT DOCUMENTS

| | | | |
|---|---|---|---|
| CN | 204 496 489 U | 7/2015 | |
| CN | 210 156 965 U | 3/2020 | |
| CN | 212 210 522 U | 12/2020 | |
| WO | WO-2019180620 A1 * | 9/2019 | ......... H01F 27/2804 |
| WO | 2020/171886 A1 | 8/2020 | |

OTHER PUBLICATIONS

Machine translate of CN210156965U (Mar. 27, 2020) (Year: 2020).*
Extended European Search Report dated Feb. 18, 2025 for corresponding European Application No. 22821052.2.
PCT/US2022/032877 International Search Report and Written Opinion dated Nov. 30, 2022 (14 pages).
Bakar, M.A., et al. "High frequency (MHz) soft switched flyback dc-dc converter using GaN switches and six-layered PCB transformer," 8th IET International Conference on Power Electronics, Machines and Drives (PEMD 2016) (online], Jan. 2016 (online] <https://www.researchgate.net/publication/303972370><DOI: 10.1049/cp.2016.0154>.

* cited by examiner

*Primary Examiner* — Edward Tso
(74) *Attorney, Agent, or Firm* — Michael Best & Friedrich LLP

(57) ABSTRACT

A wiring device including a first printed circuit board (PCB) that includes a first direct current (DC) output port and a second DC output port. The wiring device further includes a second PCB electrically connected with the first PCB, the second PCB including a planar transformer integrated with a surface of the second PCB and configured to output power at one or more DC voltage levels, a switch connected to the planar transformer, and a microcontroller. The microcontroller includes an electronic processor and is configured to control delivery of power from the planar transformer to at least one of the first DC output port and the second DC output port using the switch. The switch may have a Gallium Nitride (GaN) chemistry or a Silicon Carbide (SiC) chemistry.

7 Claims, 14 Drawing Sheets

GaN USB WIRING DEVICE

RELATED APPLICATIONS

This application claims the benefit of U.S. Provisional Patent Application No. 63/209,634, filed Jun. 11, 2021, the entire content of which is hereby incorporated by reference.

FIELD

The present disclosure relates generally to wiring devices that include direct current (DC) output ports.

SUMMARY

One aspect of the present disclosure provides a wiring device including a first printed circuit board (PCB) that includes a first direct current (DC) output port and a second DC output port. The wiring device further includes a second PCB electrically connected with the first PCB, the second PCB including a planar transformer integrated with a surface of the second PCB and configured to output power at one or more DC voltage levels, a switch connected to the planar transformer, and a microcontroller. The microcontroller includes an electronic processor and is configured to control delivery of power from the planar transformer to at least one of the first DC output port and the second DC output port using the switch.

Another aspect of the present disclosure provides an electrical receptacle including a rectifier configured to output power at a first DC voltage level and a converter configured to convert the power from the first DC voltage level to a second DC voltage level. The converter includes at least one switching device that has at least one of the group consisting of a Gallium Nitride (GaN) chemistry and a Silicon Carbide (SiC) chemistry. The electrical receptacle further includes at least one DC output port configured to receive power form the converter at the second DC voltage level and a microcontroller having an electronic processor configured to control a frequency at which the at least one switching device is operated.

Another aspect of the present disclosure provides a charging circuit included in an electrical receptacle. The charging circuit includes an output unit including at least a first DC output port and a second DC output port. The charging circuit also includes a primary power supply configured to provide a first DC current directly to the first DC output port. The charging circuit further includes a secondary power supply configured to receive a second DC current directly from the primary power supply and provide a third DC current directly to the second DC output port. The charging circuit further includes a first current sensor configured to sense a value of the third DC current and an aggregate current sensor configured to sense a value of a combined current provided to the output unit.

Before any embodiments are explained in detail, it is to be understood that the embodiments are not limited in its application to the details of the configuration and arrangement of components set forth in the following description or illustrated in the accompanying drawings. The embodiments are capable of being practiced or of being carried out in various ways. Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings.

In addition, it should be understood that embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic-based aspects may be implemented in software (e.g., stored on non-transitory computer-readable medium) executable by one or more processing units, such as a microprocessor and/or application specific integrated circuits ("ASICs"). As such, it should be noted that a plurality of hardware and software based devices, as well as a plurality of different structural components, may be utilized to implement the embodiments. For example, "servers," "computing devices," "controllers," "processors," etc., described in the specification can include one or more processing units, one or more computer-readable medium modules, one or more input/output interfaces, and various connections (e.g., a system bus) connecting the components.

Relative terminology, such as, for example, "about," "approximately," "substantially," etc., used in connection with a quantity or condition would be understood by those of ordinary skill to be inclusive of the stated value and has the meaning dictated by the context (e.g., the term includes at least the degree of error associated with the measurement accuracy, tolerances [e.g., manufacturing, assembly, use, etc.] associated with the particular value, etc.). Such terminology should also be considered as disclosing the range defined by the absolute values of the two endpoints. For example, the expression "from about 2 to about 4" also discloses the range "from 2 to 4". The relative terminology may refer to plus or minus a percentage (e.g., 1%, 5%, 10%, or more) of an indicated value.

It should be understood that although certain drawings illustrate hardware and software located within particular devices, these depictions are for illustrative purposes only. Functionality described herein as being performed by one component may be performed by multiple components in a distributed manner. Likewise, functionality performed by multiple components may be consolidated and performed by a single component. In some embodiments, the illustrated components may be combined or divided into separate software, firmware and/or hardware. For example, instead of being located within and performed by a single electronic processor, logic and processing may be distributed among multiple electronic processors. Regardless of how they are combined or divided, hardware and software components may be located on the same computing device or may be distributed among different computing devices connected by one or more networks or other suitable communication links. Similarly, a component described as performing particular functionality may also perform additional functionality not described herein. For example, a device or structure that is "configured" in a certain way is configured in at least that way but may also be configured in ways that are not explicitly listed.

Other aspects of the application will become apparent by consideration of the detailed description and accompanying drawings.

DETAILED DESCRIPTION

Figure 1:
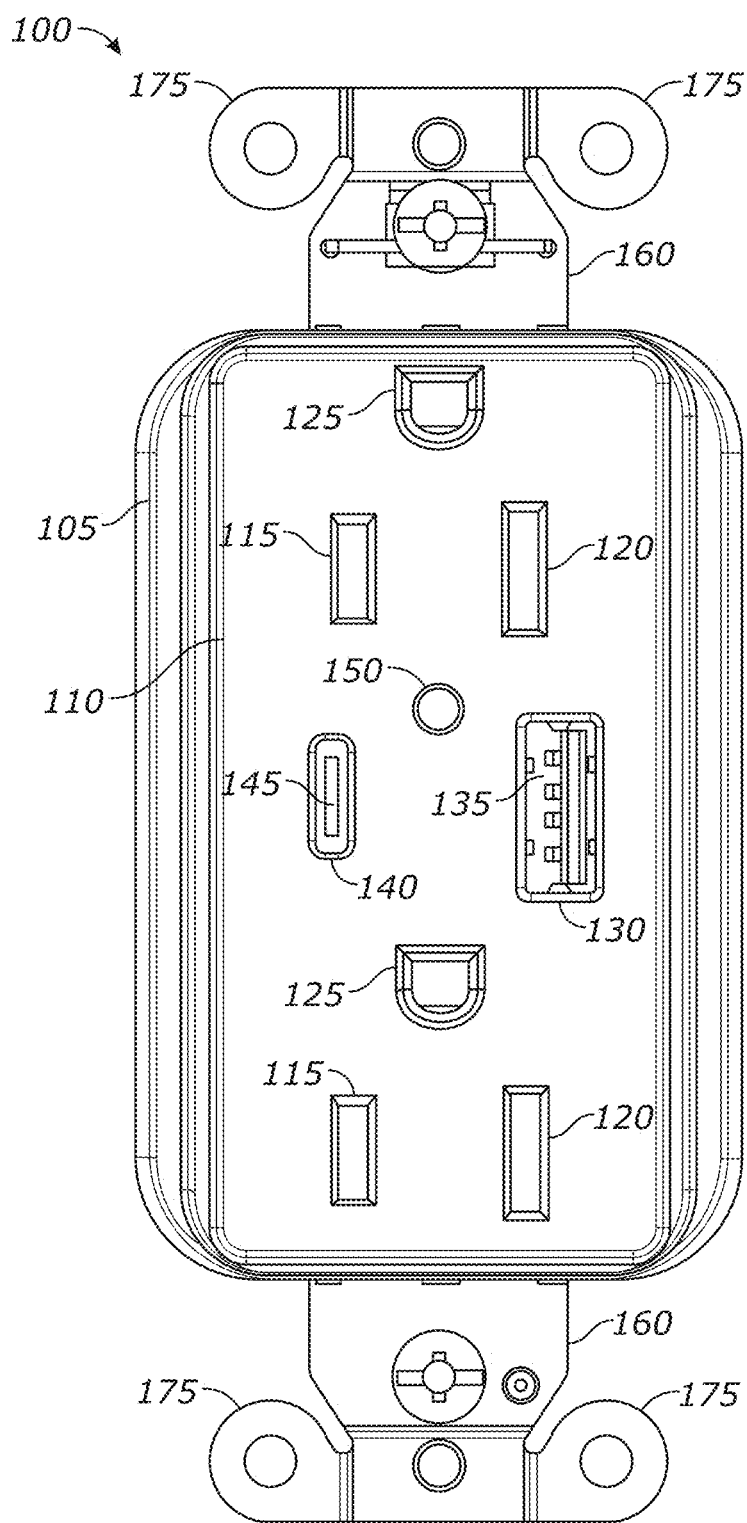
FIG. 1 illustrates a perspective view of a wiring device, or electrical receptacle, according to some embodiments.

Before any embodiments of the application are explained in detail, it is to be understood that the application is not limited in its application to the details of construction and the arrangement of components set forth in the following description or illustrated in the following drawings. The application is capable of other embodiments and of being practiced or of being carried out in various ways FIG. 1 illustrates a frontal view of a wiring device, or electrical receptacle, 100 according to some embodiments of the present disclosure. The receptacle 100 includes a front cover 105 having an outlet face 110 with phase, or hot, openings 115, neutral openings 120, and ground openings 125. In some embodiments, the outlet face 110 includes fewer phase, neutral, and ground openings than the illustrated embodiment. In some embodiments, the outlet face 110 includes more phase, neutral, and ground openings than the illustrated embodiment. In some embodiments, the outlet face 110 does not include any phase, neutral, and ground openings. In such embodiments, the outlet face 110 only includes openings that accommodate USB ports.

As shown in FIG. 1, the face 110 further includes a first opening 130 accommodating a first direct current (DC) charging port, or USB port, 135. The face 110 further includes second opening 140 accommodating a second DC charging port, or USB port, 145. In some embodiments, such as the illustrated embodiment, the first USB port 135 is a USB type A (USB-A®) port and the second USB port 145 is a USB type C (USB-C®) port. In some embodiments, the first and second USB ports 135, 145 are implemented as other types of USB ports. For example, the first and second USB ports 135, 145 may be implemented as any combination of USB-A®, USB-B®, USB-C®, mini USB-A®, mini USB-B®, micro USB-A®, micro USB-B®, and/or other types of USB ports. In some embodiments, the outlet face 110 is configured to accommodate more than two USB ports included in receptacle 100. For example, the outlet face may include three, four, five, or more USB ports. In some embodiments, the outlet face 110 is configured to accommodate a single USB port included in receptacle 100. In some embodiments, the USB ports are implemented as other types of direct current (DC) charging ports.

In some embodiments, the outlet face 110 further includes one or more additional openings 150. The one or more additional openings 150 accommodate indicators, such as but not limited to, various colored light-emitting diodes (LEDs). In some embodiments, the one or more additional openings 150 accommodate bright LEDs used, for example, as a charging indicator. In some embodiments, the one or more additional openings 150 accommodate bright LEDs used, for example, as a nightlight. In some embodiments, the one or more additional openings 150 accommodate a photoconductive photocell used, for example, to control the nightlight LEDs. In some embodiments, the one or more additional openings 150 provide access to a set screw for adjusting a photocell device or a buzzer in accordance with this, as well as other, embodiments.

The receptacle 100 also includes a rear cover, or base, 155 (FIGS. 2A-2B) that is secured to the front cover 105. In some embodiments, the front cover 105 is secured to the base 155 by a plurality of fasteners (not shown or enumerated). In some embodiments, the front cover 105 is secured to the base 155 by a snap-fit connection. The receptacle 100 further includes a plurality of terminals for connecting electrical conductors and a ground yoke/bridge assembly 160. The plurality of terminals include a phase (hot) terminal 165 and a neutral (white) terminal 170. In some embodiments, the phase and neutral terminals 165, 170 are located on a first side of the base 155 and respectively include screws for securing terminal conductors. In other embodiments, the phase and neutral terminals 165, 170 are implemented using a snap-fit connection. The receptacle 100 may further include a ground terminal that is electrically connected to the ground yoke/bridge assembly 160, which includes standard mounting ears 175 that protrude from ends of the receptacle 100.

Figure 2A:
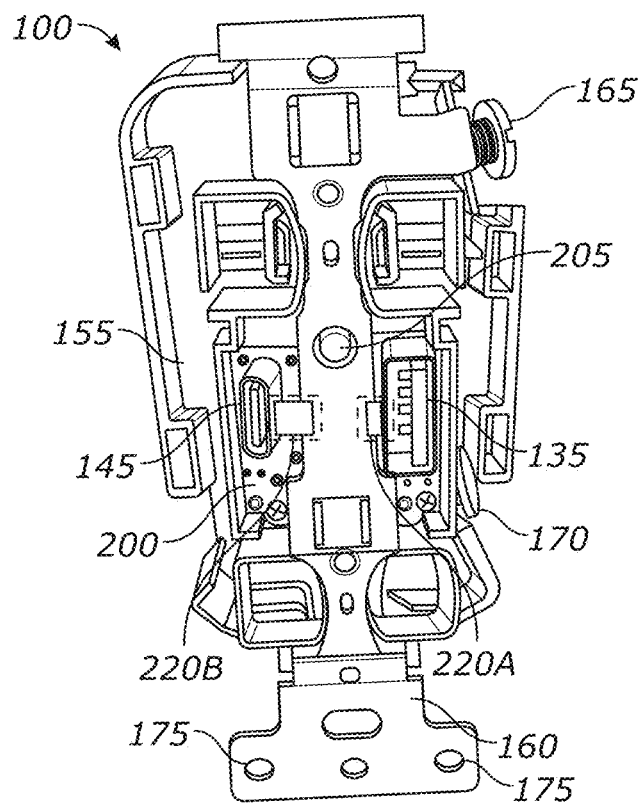
FIGS. 2A and 2B illustrate perspective views of the receptacle of FIG. 1 with a front cover removed, according to some embodiments.
Figure 2B:
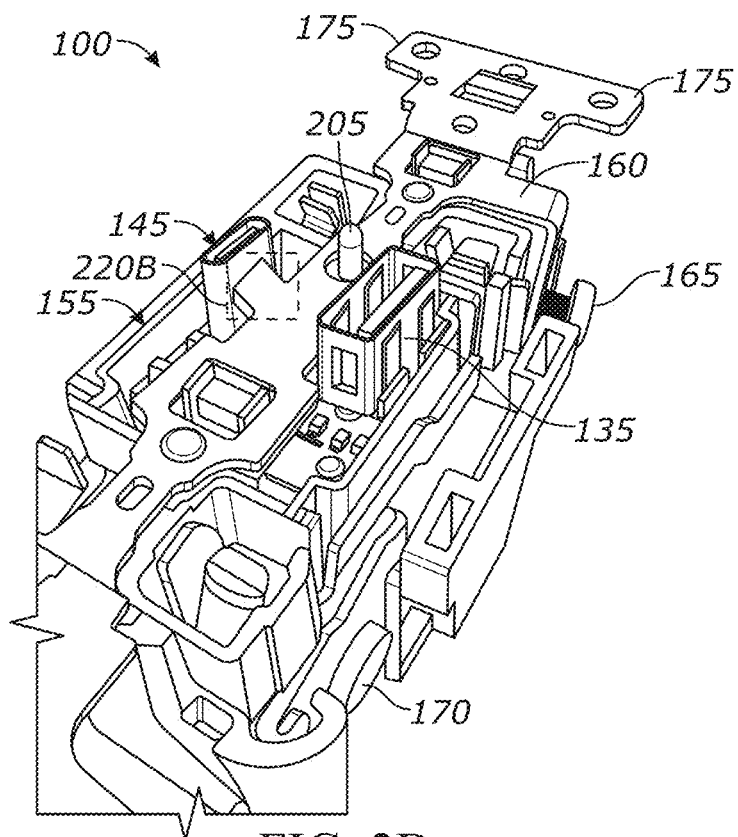

FIGS. 2A-2B illustrate perspective views of the receptacle 100 in which the front cover 105 has been removed to expose some of the internal components included in receptacle 100. As shown, the receptacle 100 includes a secondary printed circuit board (PCB), or secondary board, 200. The secondary board 200 provides control and physical support for the first and second USB ports 135, 145. In addition, the secondary board 200 provides control and physical support for one or more LED indicators 205 accommodated within the one or more additional openings 150.

Figure 3A:
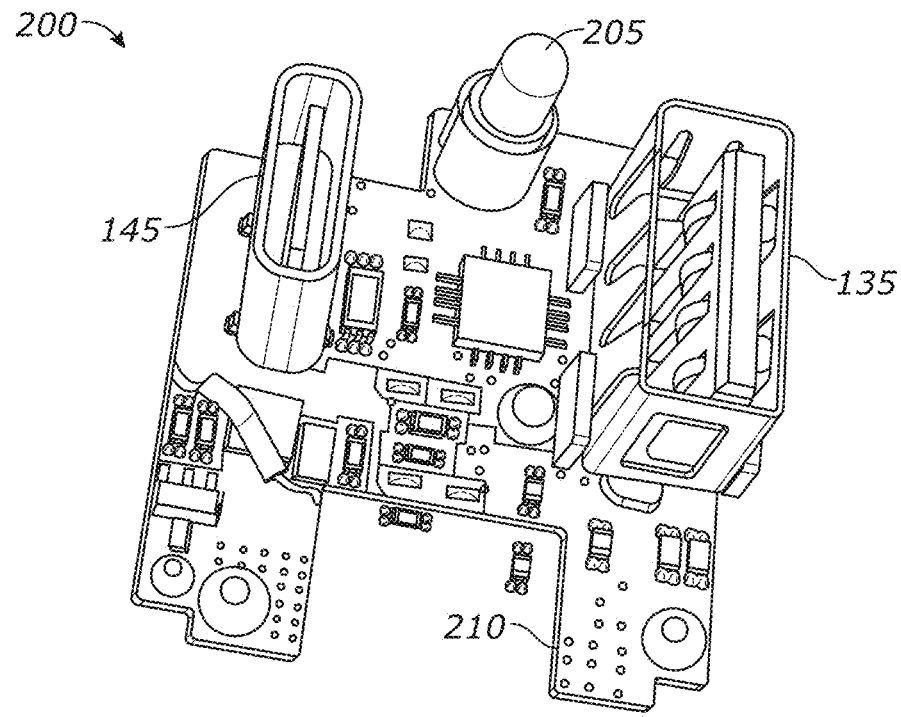
FIGS. 3A and 3B illustrate perspective views of a secondary PCB included in the receptacle of FIG. 1, according to some embodiments.
Figure 3B:
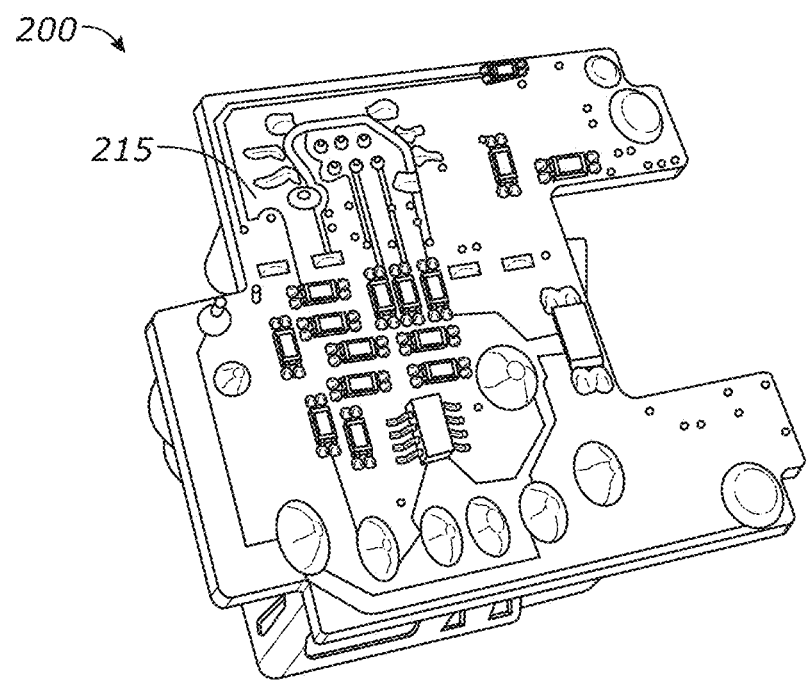

FIGS. 3A-3B illustrate perspective views of the secondary board 200. In particular, FIG. 3A illustrates a perspective view of a top surface 210 of the secondary board 200. As shown, the top surface 210 provides physical support for the first USB port 135, the second USB port 145, and an indicator 205. In some embodiments, the top surface 210 may further provide physical support for one or more control electronics configured to control the voltage and/or current output of the first and second USB ports 135, 145. For example, the control electronics supported by the top surface 210 of secondary board 200 may include one or more microchips, microcontrollers, switching devices, and/or logic elements. In some embodiments, switching devices supported by the secondary board 200 are formed of silicon carbide (SiC). In other embodiments, switching devices supported by the secondary board 200 are formed of gallium nitride (GaN). As shown in FIG. 3B, the secondary board 200 also includes a bottom surface 215 that may be arranged to provide physical support for one or more additional control electronics.

With reference back to FIGS. 2A-2B, the receptacle 100 further includes one or more ground contacts 220 supported by the ground yoke/bridge assembly 160. The ground contacts 220 are formed of a conducting material and arranged to extend from the ground yoke/bridge assembly 160. In some embodiments, the ground contacts 220 are spring-loaded metal conducting tabs that protrude from the ground yoke/bridge assembly 160. In some embodiments, the ground contacts 220 are cantilevered conducting tabs that extend from the ground yoke/bridge assembly 160. In other embodiments, the ground contacts 220 are implemented as other types of conductive elements that protrude from the ground yoke/bridge assembly 160.

As shown, a respective ground contact 220 extends from the ground yoke/bridge assembly 160 and physically contacts a respective USB port. Accordingly, a respective ground contact 220 provides a current path from a respective USB port to electrical ground (e.g., the ground yoke/bridge assembly 160). For example, as shown in FIG. 2A, a first ground contact 220A extends from the ground yoke/bridge assembly 160 to physically and electrically contact a surface of the first USB port 135. Likewise, a second ground contact 220B extends from the ground yoke/bridge assembly 160 to physically and electrically contact the second USB port 145. Inclusion of ground contacts 220 in the receptacle 100 is advantageous, as the ground contacts 220 replace and/or eliminate the need for additional ground wires connected between the USB ports 135, 145 and the ground yoke/bridge assembly 160. Furthermore, the ground contacts 220 reduce radiated emissions and provide additional shielding necessary for shunting electrostatic discharge events between conductors included in the receptacle 100.

The receptacle 100 further includes a primary printed circuit board, or primary board, 400 (FIGS. 4A-4B and 6), according to some embodiments. The primary board 400 provides control and physical support for many of the working components included in the receptacle 100. For example, the primary board 400 provides control and physical support for the secondary board 200. That is, in some embodiments, components of the primary board 400 may be configured to control the flow of current to one or more of the components of the secondary board 200 (e.g., the first USB port 135, the second USB port 145, the one or more indicators 205, etc.). In some embodiments, the primary board 400 is connected to the secondary board 200 by a plurality of wires, pins, metal contacts, and/or other conductive members. In some embodiments, the secondary board 200 and primary board 400 are implemented as a single board.

Figure 4A:
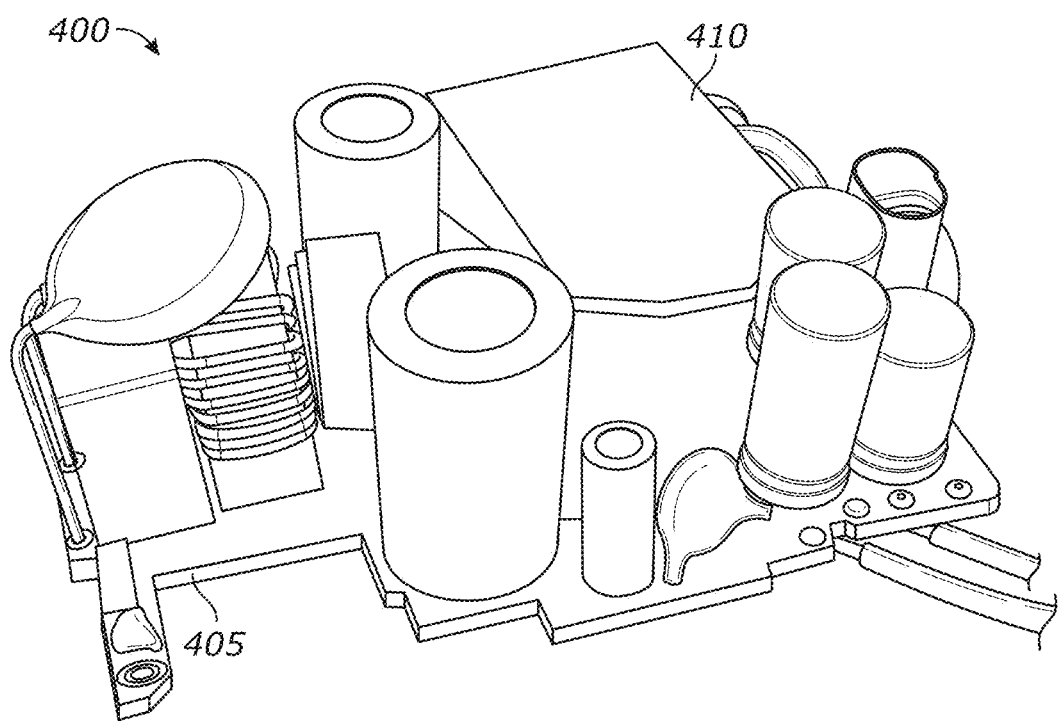
FIGS. 4A and 4B illustrate perspective views of a primary PCB included in the receptacle of FIG. 1, according to some embodiments.
Figure 4B:
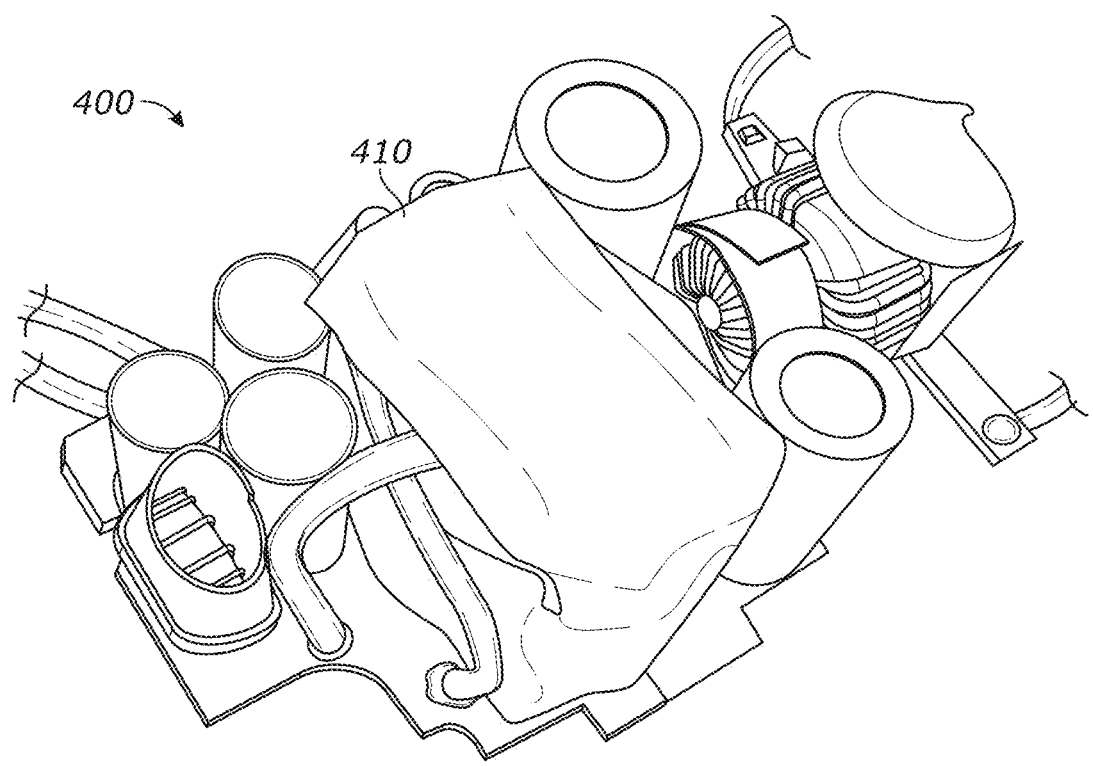
Figure 5A:
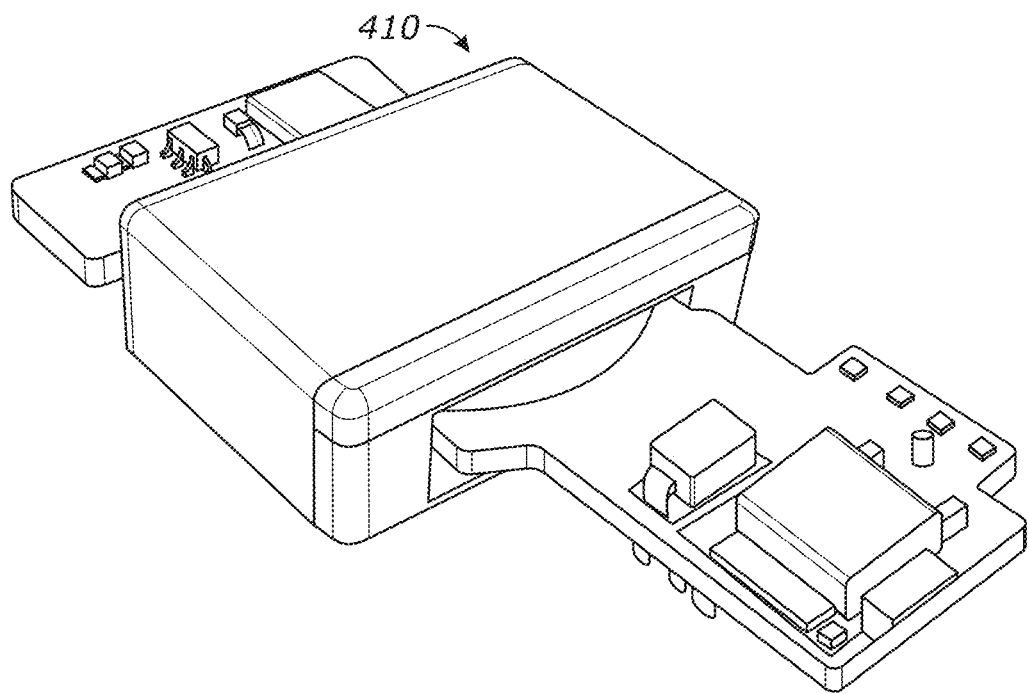
FIGS. 5A-5C illustrate various embodiments of a transformer included in the receptacle of FIG. 1.
Figure 5B:
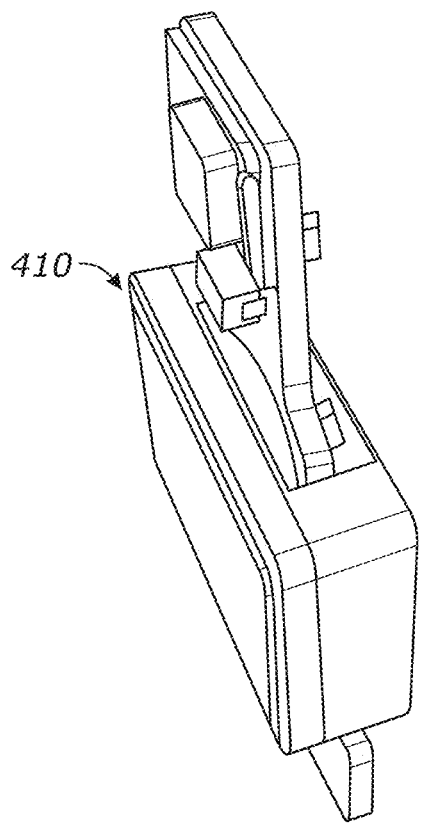
Figure 5C:
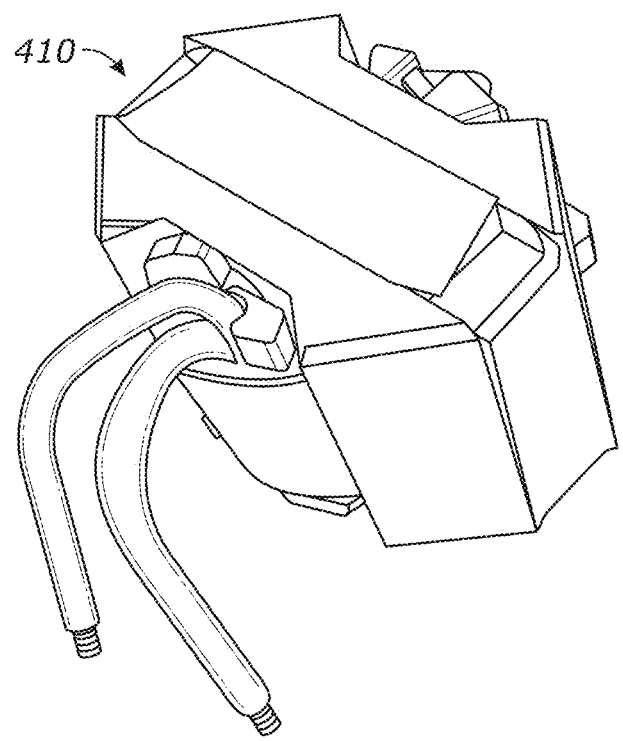

FIGS. 4A-4B illustrate perspective views of a top surface 405 of the primary board 400. As shown, the top surface 405 provides support for a plurality of power electronics, such as transformer 410, one or more capacitors, one or more inductors, one or more switching devices, and/or one or more circuit interrupting devices. In the illustrated embodiments, the transformer 410 is implemented as a discrete, wound transformer that protrudes outward from the top surface 405. However, in some embodiments, the transformer 410 is implemented as a planar transformer integrated with the primary board 400. For example, FIGS. 5A-5B illustrate embodiments of a planar transformer 410 that may be integrated with the primary board 400. When compared to a discrete, wound transformer such as the one shown in FIG. 5C, the planar transformer's intrinsically low profile shape improves space savings within the receptacle 100. Furthermore, the planar transformer 410 is formed of a low-loss core material that improves efficiency of the receptacle 100. In some embodiments, the transformer 410 is implemented as a flyback converter. In other embodiments, the transformer 410 is implemented using other switch-mode circuit topologies.

Figure 6:
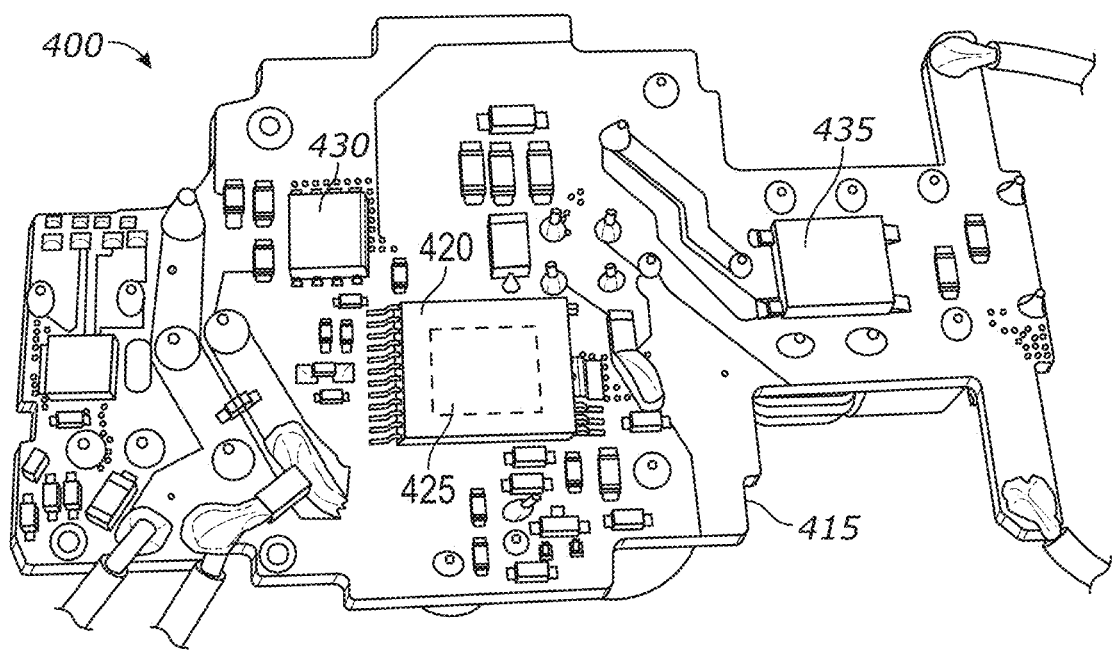
FIG. 6 illustrates a perspective view of a primary PCB included in the receptacle of FIG. 1, according to some embodiments.

FIG. 6 illustrates a perspective view of a bottom surface 415 of the primary board 400. As shown, the bottom surface 415 provides support for a plurality of control electronics, such as microcontroller 420, a first switch 425, and a second switch 430, and an input bridge rectifier 435. In the illustrated embodiment, the first switch 425 is included in, or integrated within, the microcontroller 420. However, in other embodiments, the microcontroller 420 and the first switch 425 are implemented as separate components. In some embodiments, the bottom surface 415 provides support for one or more additional microcontrollers and/or switches. Furthermore, it should be understood that the control electronics illustrated in FIG. 6 are not limited to placement on the bottom surface 415, as in some embodiments, some or all of the one or more control electronics are mounted to the top surface 405. Similarly, in some embodiments, some or all of the power and control electronics supported by the top surface 405 are mounted to, or otherwise supported by, the bottom surface 415.

The microcontroller 420 is an integrated circuit device, such as a Microchip microcontroller that includes an electronic processor and a memory. In some embodiments, the microcontroller 420 is implemented as a PIC18F Microchip microcontroller. However, in other embodiments, the microcontroller 420 is implemented as another type of microcontroller. As will be described in more detail later on, the microcontroller 420 is configured to control various operations of the receptacle 100. For example, the microcontroller 420 may be configured to control the delivery of charging power to one or more peripheral devices (e.g., smartphones, tablets, headphones, etc.) connected to the first and/or second USB ports 135, 145. As another example, the microcontroller 420 may be configured to control operation of the first and second switches 425, 430. As another example, the microcontroller 420 may be electrically connected to and configured to control operation of one or more control electronic components included in the secondary board 200 (e.g., a second microcontroller, one or more switches, etc.).

As will be described in more detail below, the first and second switches 425, 430 are included in a charging circuit and used to control an amount of DC charging power provided to one or more peripheral devices connected to the first and/or second USB ports 135, 145. For example, the first switch 425 may be used to control output of the transformer 410 and the second switch 430 may be used to control output of one or more secondary power supplies. As another example, both the first and second switches 425, 430 are used to control output of the transformer 410. In some embodiments, the microcontroller 420 is configured to control operation of both the first and second switches 425, 430. In some embodiments, a first microcontroller is configured to control operation of the first switch 425 and a second microcontroller is configured to control operation of the second switch 430. In some embodiments, one or more driving circuits are used to control operation of the first and second switches 425, 430.

In some embodiments, the first switch 425, the second switch 430, and/or any other switching element included in the charging circuit of receptacle 100 are implemented as conventional silicon switches, such as traditional silicon MOSFETs. However, the frequency and loss characteristics of conventional silicon switches impose a practical limit on the maximum power density of charging circuits, such as switch-mode converters, included in electrical receptacles. Moreover, the highest possible power that can be processed in a confined space (like that of an electrical) is at or approaching the practical limit in present, conventional silicon switching devices.

Accordingly, in some embodiments, silicon switching devices included in the power conversion circuit are replaced with GaN and/or SiC transistors aid/or diodes. That is, in some embodiments, the first switch 425, second switch 430, and/or any switching element within the charging circuit that would benefit from reduced switching and conduction losses are implemented as GaN or SiC transistors or diodes. When compared to silicon, the chemistry of wide-bandgap materials, such as GaN or SiC, allows for reduced conduction and switching losses and higher frequency commutation. Therefore, GaN or SiC switching devices have a much greater power density than traditional silicon switching devices. Thus, the nominal switching frequency of the power converter may be increased to a desired point of optimization between acceptable switching loss (temperature rise) and overall size (reactive energy storage devices) when GaN and/or SiC switching elements are implemented in place of conventional silicon switching devices. Moreover, this effective increase in power density allows for greater throughput power in existing device profiles like wiring devices and wireless chargers. In such embodiments, the microcontroller 420 is configured to set a high primary switching frequency (e.g., 100 kHz and up) for the first switch 425, second switch 430, and/or other switching elements included in the charging circuit.

Figure 7:
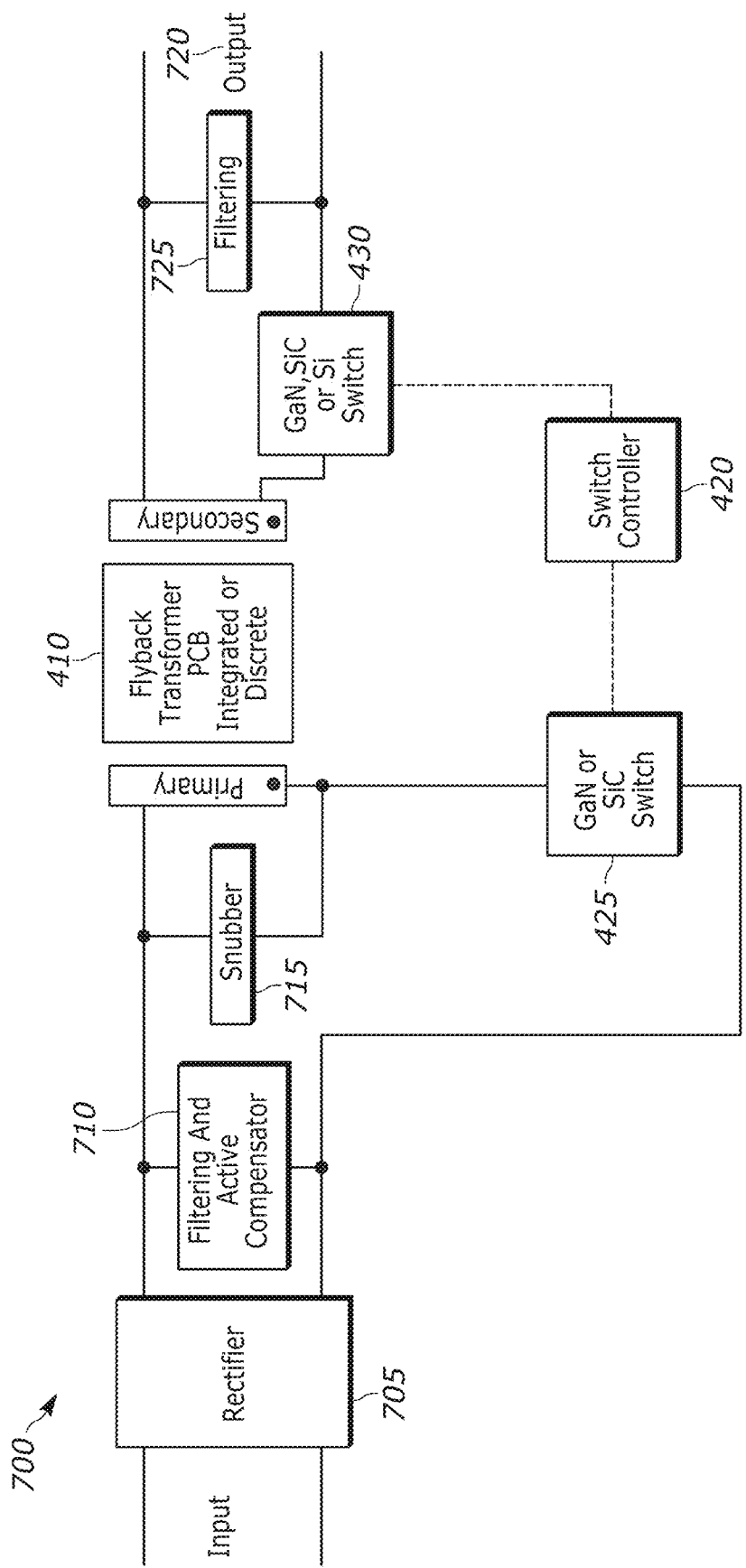
FIG. 7 is a block diagram of a charging circuit included in the receptacle of FIG. 1, according to some embodiments.

FIG. 7 illustrates a block diagram of a charging circuit 700 included in the receptacle 100, according to some embodiments. The illustrated charging circuit 700 is implemented using a switch-mode topology. However, it should be understood that in some embodiments, other power conversion topologies are used.

As shown, the power conversion circuit 700 includes, among other things, the transformer 410, the microcontroller 420, the first switch 425, and the second switch 430. The power conversion circuit 700 further includes a rectifier 705 (e.g., the input bridge rectifier 435) configured to convert alternating current (AC) input power into DC power. DC power output by the rectifier 705 is filtered by an active compensator 710 before being delivered to the primary side of transformer 410. The active compensator 710 is configured to reduce voltage ripple on the input bus while also eliminating the need for traditional, bulky storage capacitors. Accordingly, the presence of the active compensator 710 allows for smaller capacitors to be used in the charging circuit 700, thereby freeing up significant space and increasing overall power density on the input side of the charging circuit 700. In some embodiments, the active compensator 710 is implemented as a standard configuration buck-boost based compensator topology; however, it should be understood that in some embodiments, the active compensator is implemented using other topologies. In some embodiments, the charging circuit 700 further includes a snubber 715 electrically connected in parallel with the primary side of transformer 410. In such embodiments, the snubber 715 is configured to suppress voltage transient spikes at the primary side of transformer 410.

The transformer 410 is configured to output DC power at a voltage level to be provided directly to one or more peripheral devices connected to ports included in the output 720, such as the first and second USB ports 135, 145. In some embodiments, the transformer 410 is configured to output power at a fixed voltage level, such as 5V. In other embodiments, the transformer 410 is configured to output power at various voltage levels. For example, the transformer 410 may be configured to output power at 2.5V, 3V, 5V, 10V, 15V, 20V, and/or etc. In such embodiments, the microcontroller 420 is configured to control, by the first switch 425 and/or the second switch 430, the voltage level and/or amount of current provided by the transformer 410 to the outputs (e.g., the first and second USB ports 135, 145).

As described above, in some embodiments, the transformer 410 is implemented as a flyback converter. In such embodiments, the transformer 410 may be implemented as a discrete, wound transformer or as a planar transformer integrated within the primary board 400. In some embodiments, the transformer 410 is implemented as other types of DC-DC converter topologies.

The charging circuit 700 further includes a filtering circuit 725 that is used to reduce output voltage ripple. As described above, GaN and SiC switching devices exhibit much lower switching power losses than conventional silicon switches. Thus, when switches 425, 430 are implemented as GaN and/or SiC switching devices, the switches 425, 430 may be operated at higher switching frequencies (e.g., 100 kHz and up) than conventional silicon switching devices without undergoing the typical degrees of thermal stress experienced by silicon switching devices. Moreover, as GaN and/or SiC switching devices are capable of operating at such high switching frequencies, the filtering circuit 725 may be implemented using relatively small capacitors without sacrificing performance. Therefore, the cost and size of filtering circuit 725 is reduced when the first switch 425, second switch 430, and/or any other switching elements included in the circuit 700 are implemented as Gan or SiC switching devices.

Figure 8:
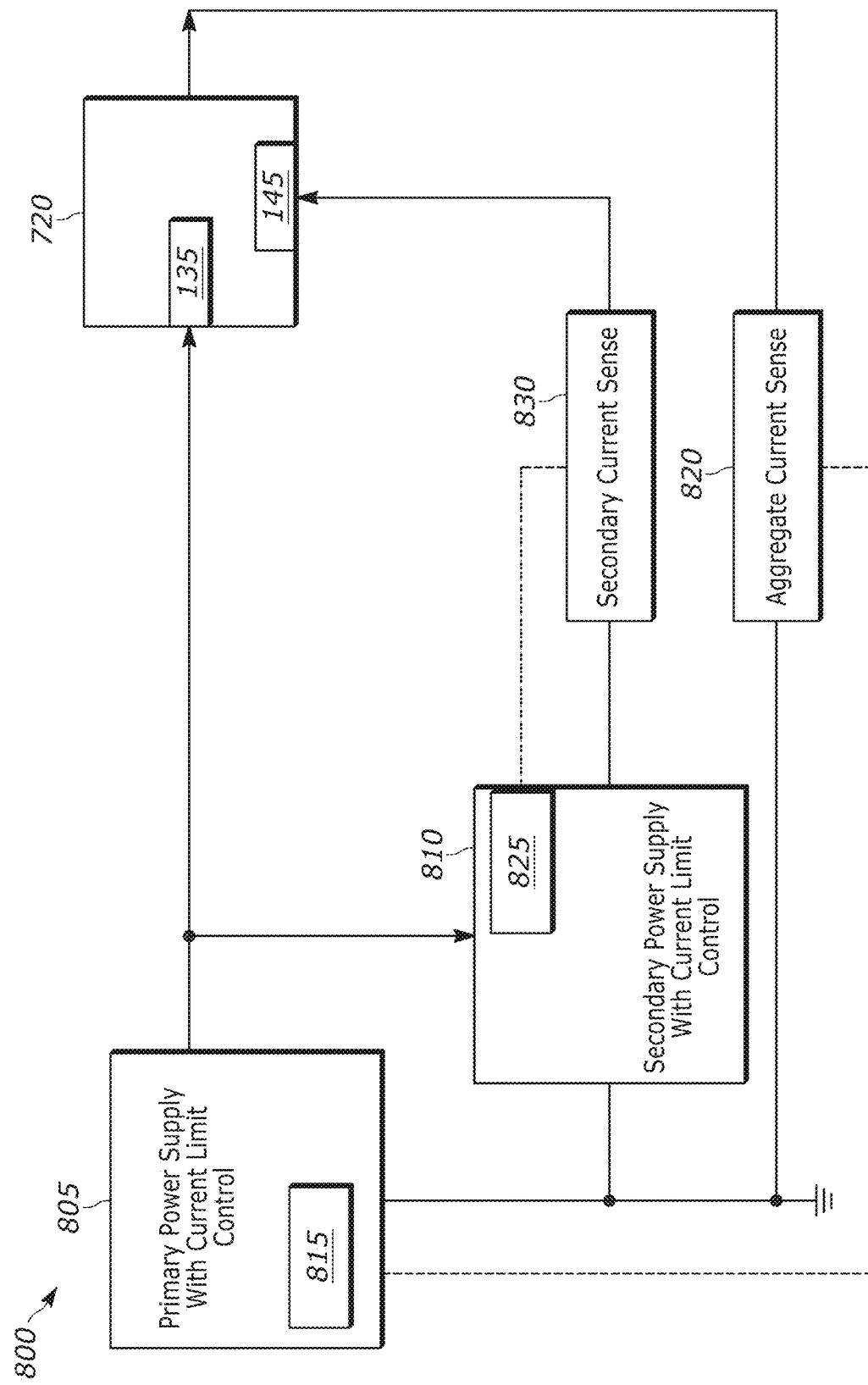
FIG. 8 is a block diagram of a charging circuit included in the receptacle of FIG. 1, according to some embodiments.

In some embodiments, the output 720 of receptacle 100 is supplied with power directly from a primary power supply, such as transformer 410. In other embodiments, the output 720 is supplied with power from a combination of the primary power supply and one or more secondary power supplies. FIG. 8 illustrates a block diagram of a charging circuit 800 included in receptacle 100 in which the output 720 is supplied with power from a primary power supply 805 and/or one or more secondary, or downstream, power supplies 810. FIG. 9 (FIGS. 9A-9D) illustrates a circuit schematic 900 of the charging circuit 800 illustrated in FIG. 8, according to some embodiments.

In some embodiments, the primary power supply 805 is implemented as the transformer 410, which additionally comprises any corresponding switching devices used to control transformer 410 (e.g., the first switch 425 and/or second switch 430). In other embodiments, the primary power supply 810 is implemented as another known type of DC-DC power converter. As shown, the primary power supply 805 is configured to provide power directly to the output 720 and at least one downstream power supply 810. In particular, the primary power supply 805 is configured to provide power directly to at least one output port included in the output 720. For example, in the illustrated embodiment, the primary power supply 805 provides power directly to the first USB port 135 and the at least one downstream power supply 810. However, in other embodiments, the primary power supply 805 is configured to provide power directly to the at least one downstream power supply 810, the first and/or second USB ports 135, 145, and/or additional output ports included in output 720.

Figure 9A:
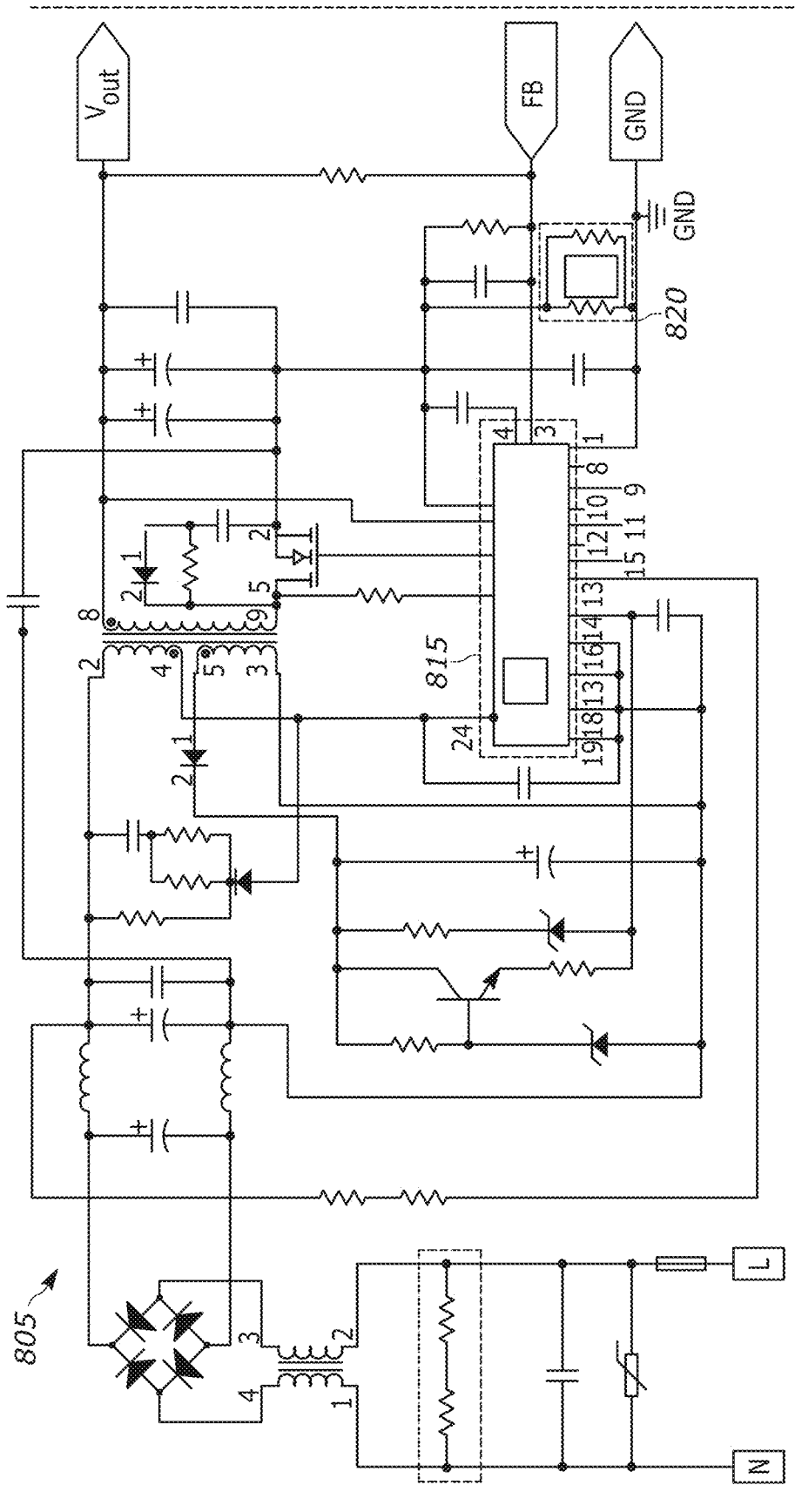
FIGS. 9A-9D is a circuit schematic of the charging circuit of FIG. 8, according to some embodiments.
Figure 9B:
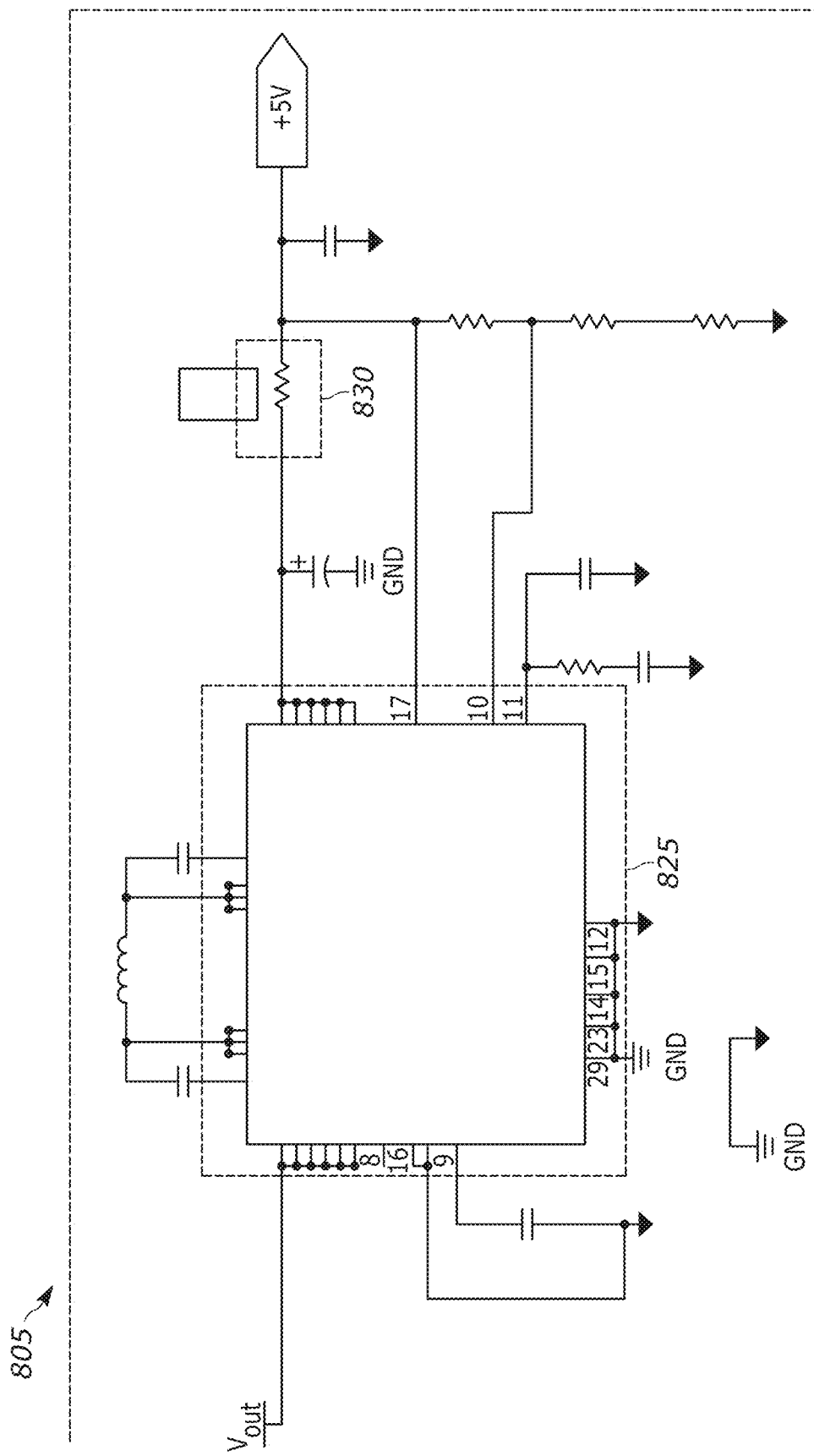
Figure 9C:
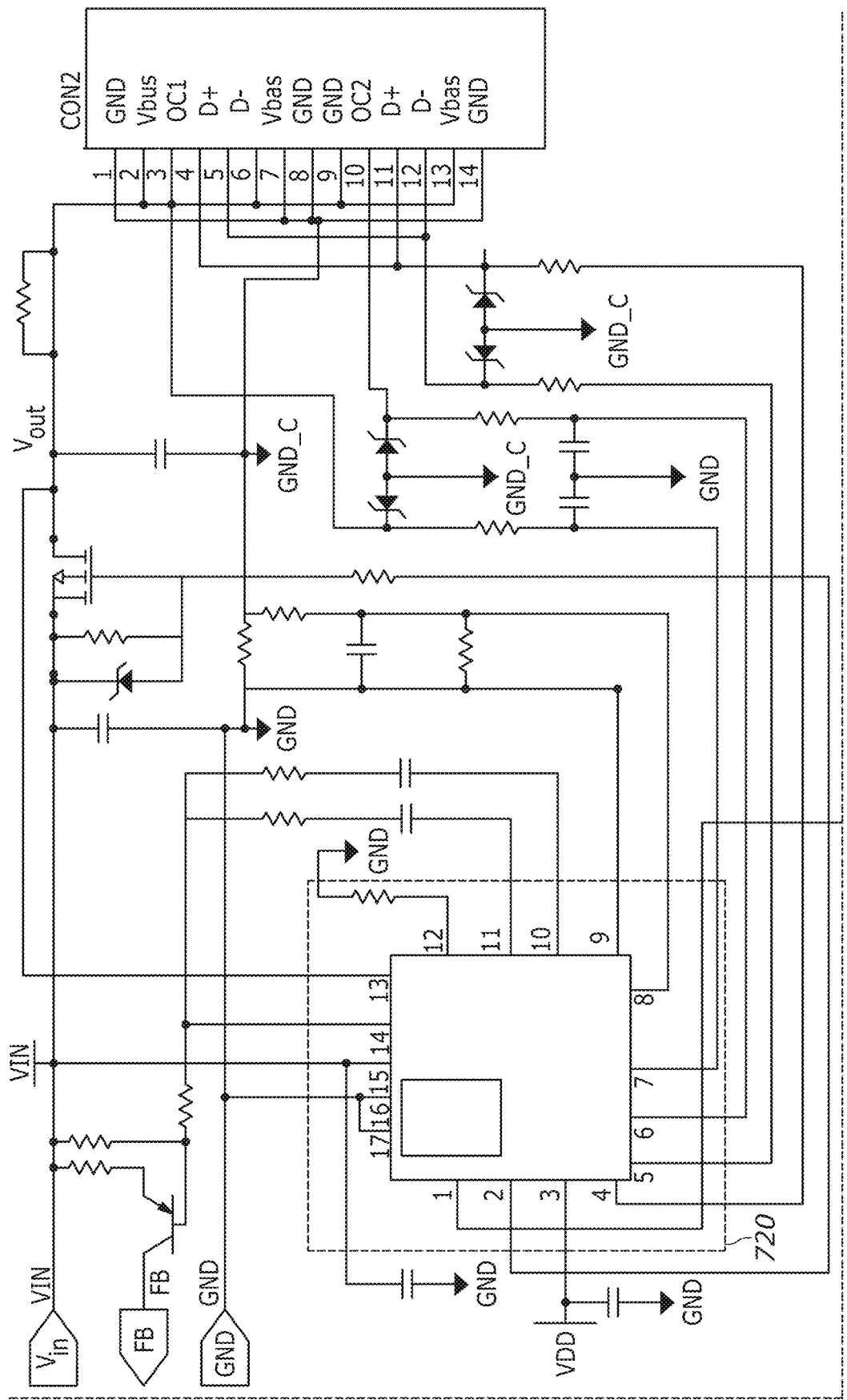
Figure 9D:
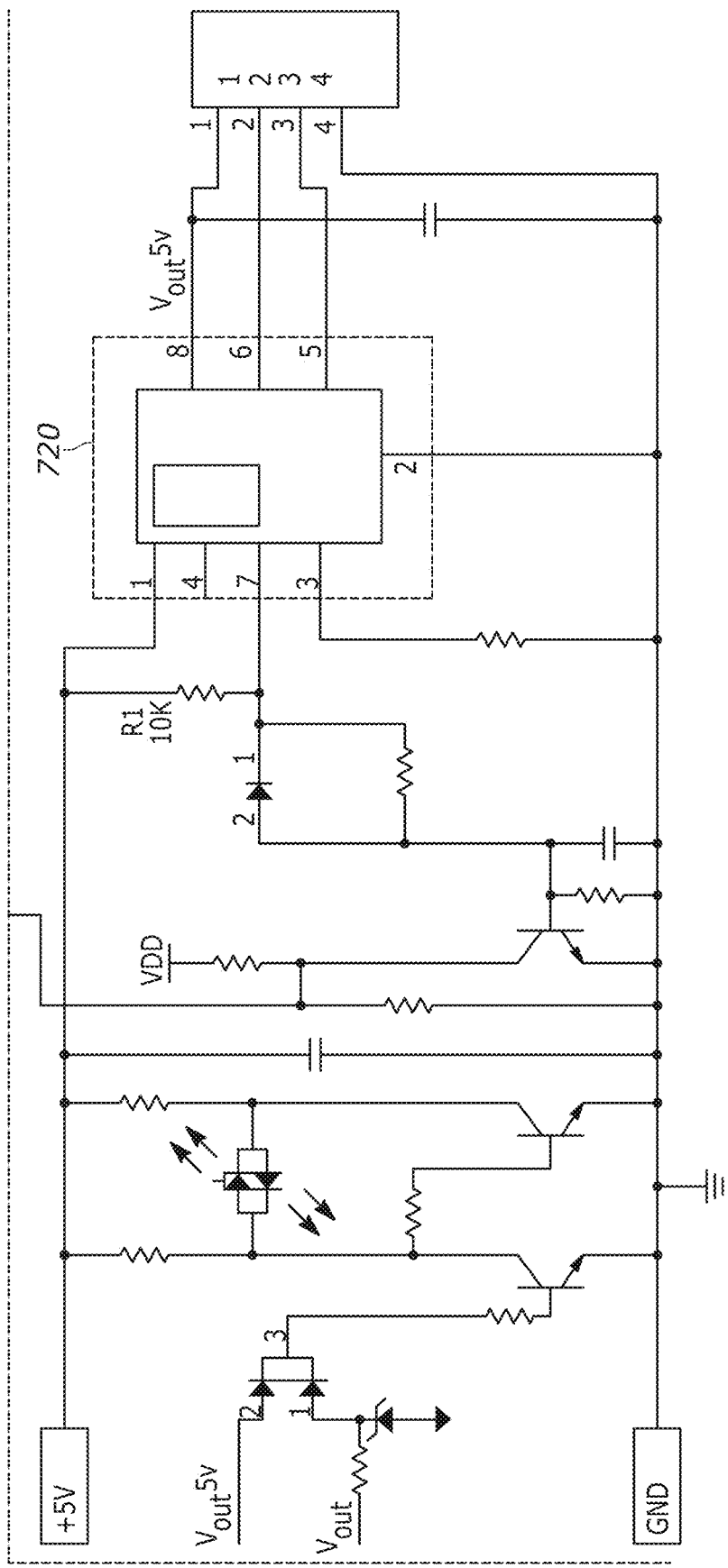

The primary power supply 805 includes a first independent control mechanism 815. In some embodiments, the first independent control mechanism 815 is implemented as the microcontroller 420 in combination with one or more switching devices, such as the first and second switches 425, 430. In other embodiments, the first independent control mechanism 815 is implemented as another type of microcontroller or logic circuit in combination with other switching devices not explicitly described herein. The charging circuit 800 further includes an aggregate current sensing circuit 820 that is configured to sense a combined current output by the primary power supply 805 and the one or more downstream power supplies 810. As shown in FIG. 9A, the aggregate current sensing circuit 820 may include one or more sense resistors. However, it should be understood that the aggregate current sensing circuit 820 may be implemented using any known current detection circuit.

The first independent control mechanism 815 is configured to limit current output by the primary power supply 805 to the sum of the primary power supply's 805 maximum rated output current (e.g., 5 A, 10 A, etc.) and the combined rated output current (e.g., 1 A, 3 A, 5 A) of all connected downstream power supplies 810. For example, in operation, the first independent control mechanism 815 is configured receive one or more current values sensed by the aggregate current sensor 820. Based on the received current value(s), the first independent current control mechanism 815 is configured to adjust the voltage and/or current output by the primary power supply 805. Accordingly, the first independent control mechanism 815 included in primary power supply 805 is operable to regulate the amount of power output by the charging circuit 800 based in part on a current provided directly to at least one output port included in output 720 (e.g., the first USB port 135) and current provided directly to at least one of the downstream power supplies 810.

As described above, the primary power supply 805 is configured to provide power directly to at least one downstream power supply 810. The downstream power supply 810 is configured to convert power received from the primary power supply 805 and output power directly to one of the output ports (e.g., the second USB port 145) included in output 720. In some embodiments, the downstream power supply 810 provides power to a respective output port, such as the second USB port 145, at a fixed voltage level (e.g., 5V). In other embodiments, the downstream power supply 810 is operable to provide power to a respective output port at varying voltage levels (e.g., 1V-5V). In some embodiments, the downstream power supply 810 is implemented as a flyback transformer. In other embodiments, the downstream power supply 810 is implemented using other known DC-DC converter topologies such as a buck/boost converter, buck converter, or boost converters.

The downstream power supply 810 includes a second independent control mechanism 825 that is configured to control an amount of power provided by the downstream power supply 810 to a respective output port (e.g., USB port 145) included in output 720. In particular, the second independent control mechanism 825 is configured to control power output by the downstream power supply 810 based on current values sensed by a second current sensing circuit 830. As shown in FIG. 8, the second current sensing circuit 830 is configured to sense an amount of current that is provided by the downstream power supply 810 to an individual output port (e.g., the second USB port 145) included in output 720. In some embodiments, the second independent control mechanism 825 is configured to limit the amount of current output by the downstream power supply 810 to a value that is less than or equal to the current rating of the downstream power supply 810. In other embodiments, the second independent control mechanism 825 is configured to limit current output by the downstream power supply 810 based on a current rating of a peripheral device connected to the output port receiving power from the downstream power supply 810. Similar to the first independent control mechanism 815, the second independent control mechanism 825 may be implemented as a microcontroller, a logic circuit, and/or any other type of control device operable to control the switching elements included in the downstream power supply 810.

Figure 10:
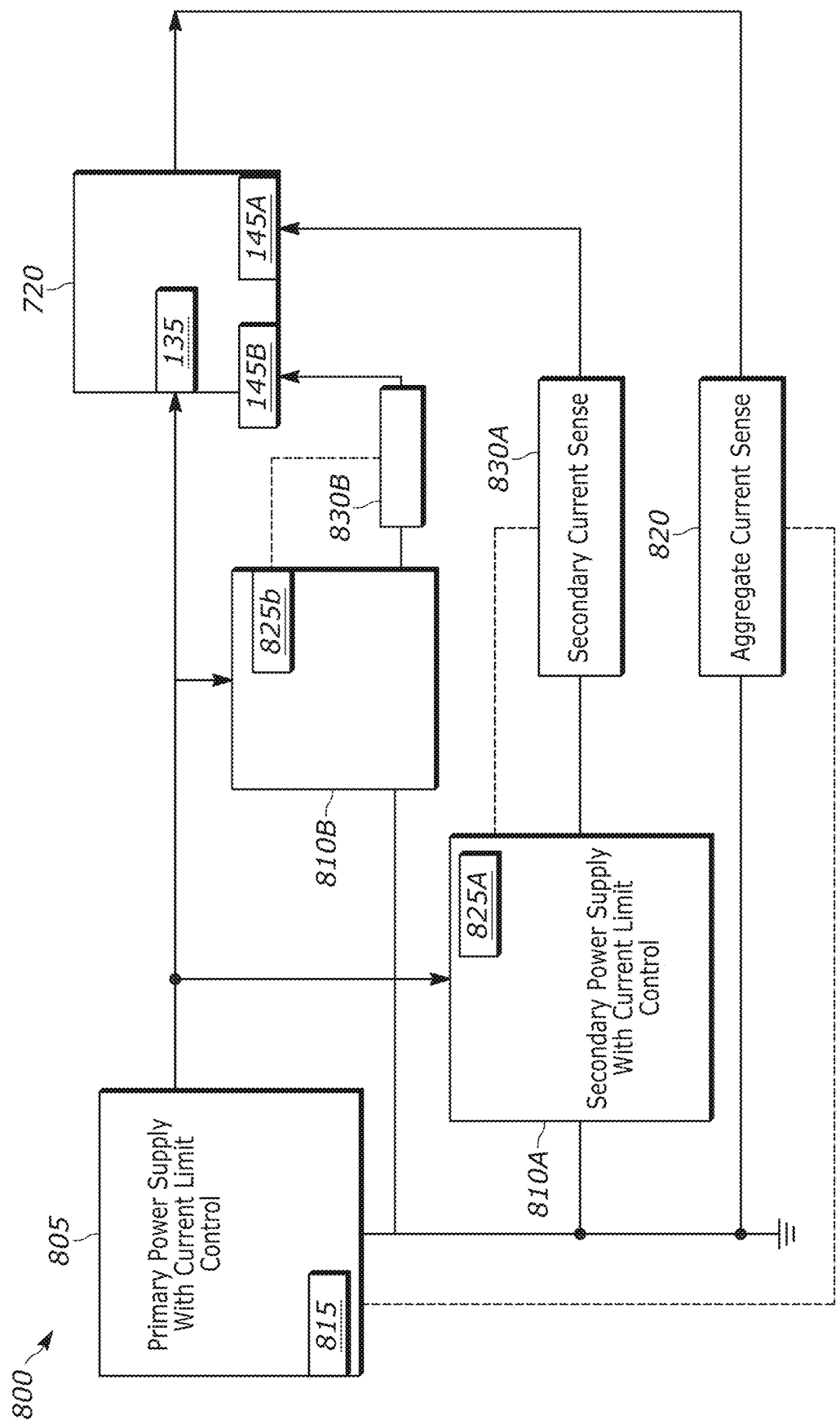
FIG. 10 is a block diagram of a charging circuit included in the receptacle of FIG. 1, according to some embodiments.

Although the charging circuit 800 is illustrated as including only a single downstream power supply 810, it should be understood that the charging circuit 800 may include any number, N, of additional downstream power supplies. For example, FIG. 10 illustrates an embodiment in which a charging circuit 800 includes first and second downstream power supplies 810A, 810B. As shown, each downstream power supply 810A, 810B is configured to receive power from the primary power supply 805 and output power to a respective output port 145A, 145B included in output 720. Moreover, an amount of power provided to each output port included in output 720 is sensed by a respective current sensing circuit and provided to a respective independent control mechanism. For example, the amount of power provided by the first downstream power supply 810A to output port 145A is sensed by the current sensing circuit 830A. Accordingly, the independent control mechanism 825A included in downstream power supply 810A is operable to control output of the downstream power supply 810A based on current values sensed by the current sensing circuit 830A. Similarly, the amount of power provided by the second downstream power supply 810B to output port 145B is sensed by the current sensing circuit 830B. Accordingly, the independent control mechanism 825B included in downstream power supply 810B is operable to control output of the downstream power supply 810B based on current values sensed by the current sensing circuit 830B.

Figure 11:
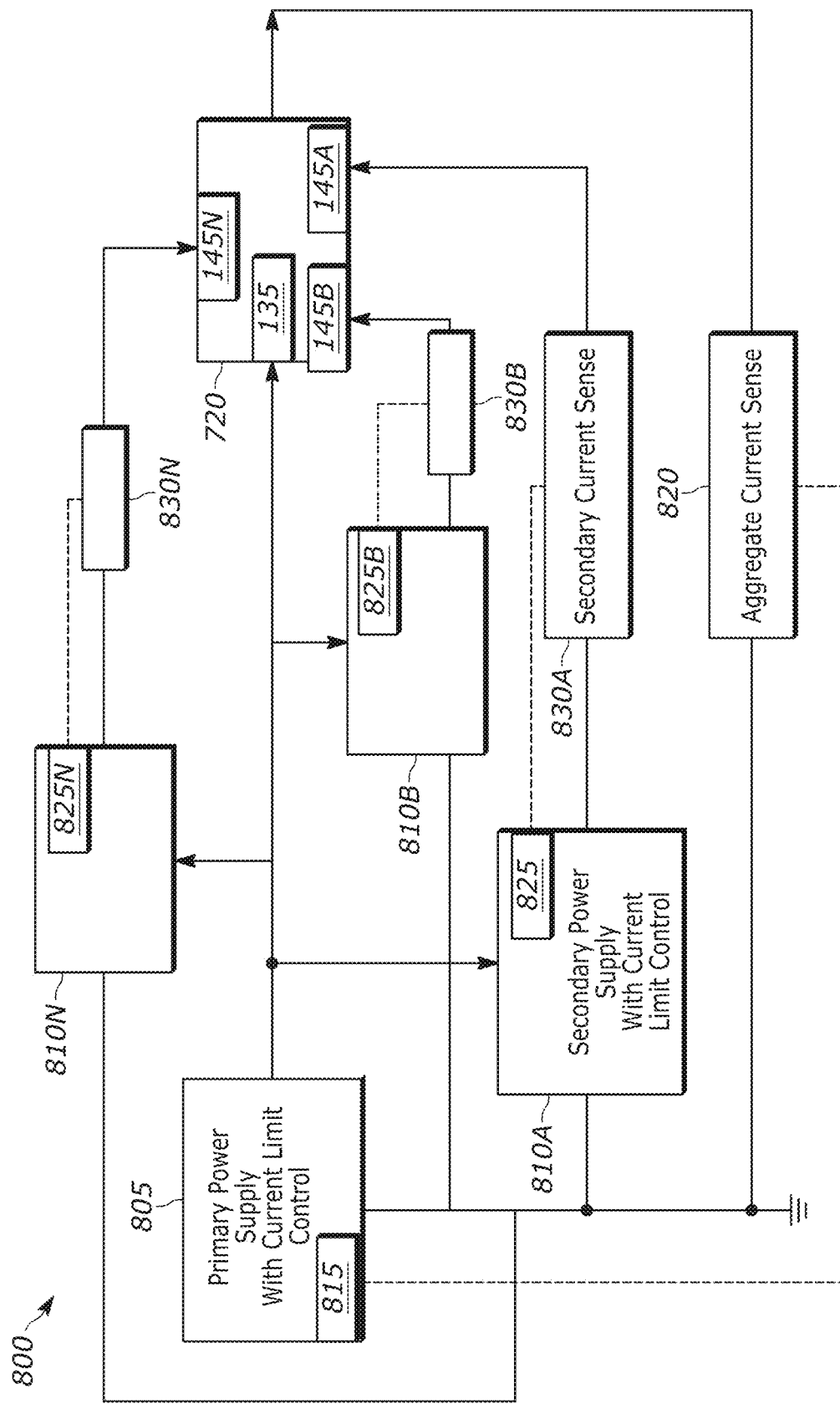
FIG. 11 is a block diagram of a charging circuit included in the receptacle of FIG. 1, according to some embodiments.

FIG. 11 illustrates a generalized embodiment of the charging circuit 800. As shown, the output 720 may include a first output port (e.g., USB output port 135) and number, N, of second output ports (e.g., USB output ports 145A-145N). In such an embodiment, the charging circuit 800 may be configured to include the primary power supply 805 and a plurality of downstream power supplies 810A-810N. Each one of the respective downstream power supplies 810A-810N receives power from the primary power supply 805 and provides power to a respective one of the second output ports 145A-145N. For example, the first downstream power supply 810A provides power directly to the second output port 145A, the second downstream power supply 810B provides power directly to the second output port 145B, and the Nth downstream power supply 810N provides power directly to the second output port 145N. Furthermore, current provided to each of the second output ports 145A-145N is sensed by a respective current sensing circuit 830A-830N. For example, the current sensing circuit 830A senses an amount of current provided by downstream power supply 810A to the second output port 145A, the current sensing circuit 830B senses an amount of current provided by downstream power supply 810B to the second output port 145B, and the current sensing circuit 830N senses an amount of current provided by downstream power supply 810N to the second output port 145N. Each downstream power supply 810A-810N includes a respective independent control mechanism 825A-825N configured to control power output by the respective downstream power supply 810A-810N based on respective current values sensed by current sensing circuits 830A-830N. Accordingly, the charging circuit 800 illustrated in FIG. 11 is operable of regulating power output by the primary power supply 805 and downstream power supplies 810A-810N to a plurality of peripheral devices connected to the first output port 135 and the second output ports 145A-145N.

In some embodiments, the charging circuit 800 includes an additional current sensing circuit configured to sense an amount of current provided by the primary power supply 805 to the at least one output port, such as USB port 135, included in output 720. In other embodiments, the first independent control mechanism 815 is configured to determine the amount of current provided by primary power supply 805 directly to the at least on output port by subtracting a sum of current values sensed by current sensing circuits 825A-825N from the combined current value sensed by the aggregate current sensing circuit 820. In some embodiments, the primary power supply 805 is configured to provide power directly to more than one output port, as well as one or more downstream power supplies 810A-810N. In some embodiments, one or more downstream power supplies 810A-810N are operable to provide power directly to one or more other downstream power supplies 810A-810N.

Thus, aspects described herein provide, among other things, digital load cell transducers that include position detection capabilities. Various features and advantages are set forth in the following claims.

What is claimed is:

1. A wiring device comprising:
   a first printed circuit board (PCB) including:
      a first direct current (DC) output port, and
      a second DC output port; and
   a second PCB electrically connected with the first PCB, the second PCB including:
      a planar transformer integrated with a surface of the second PCB and configured to output power at one or more DC voltage levels,
      a switch connected to the planar transformer, and
      a microcontroller including an electronic processor, the microcontroller configured to control delivery of power from the planar transformer to at least one of the first DC output port and the second DC output port using the switch,
   a ground terminal;
   a ground yoke assembly electrically connected to the ground terminal; and
   a first metal contact arranged to extend from the ground yoke assembly and physically contact the first DC port.

2. The wiring device of claim 1, wherein the first metal contact electrically connects the first DC port to the ground yoke assembly.

3. The wiring device of claim 1, wherein the first metal contact is a spring-loaded conductive tab.

4. The wiring device of claim 1, wherein the first metal contact is a cantilevered conductive tab.

5. The wiring device of claim 1, wherein the switch has at least one selected from the group consisting of a Gallium Nitride (GaN) chemistry and a Silicon Carbide (SiC) chemistry.

6. The wiring device of claim 1, wherein the planar transformer is a flyback converter.

7. The wiring device of claim 1, wherein the switch is connected to a primary side of the planar transformer or a secondary side of the planar transformer.

* * * * *